United States Patent
Kuo et al.

(10) Patent No.: US 7,672,159 B2
(45) Date of Patent: Mar. 2, 2010

(54) METHOD OF OPERATING MULTI-LEVEL CELL

(75) Inventors: Ming-Chang Kuo, Hsinchu (TW); Chao-I Wu, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 215 days.

(21) Appl. No.: 11/620,462

(22) Filed: Jan. 5, 2007

(65) Prior Publication Data

US 2008/0165578 A1 Jul. 10, 2008

(51) Int. Cl.
*G11C 16/04* (2006.01)
(52) U.S. Cl. .................. 365/185.03; 365/185.27; 365/185.28; 365/185.29
(58) Field of Classification Search ............ 365/185.03, 365/185.18, 185.27, 185.28, 185.29
See application file for complete search history.

(56) References Cited

U.S. PATENT DOCUMENTS

| | | | |
|---|---|---|---|
| 6,011,725 A | 1/2000 | Eitan | |
| 6,331,951 B1 | 12/2001 | Bautista, Jr. et al. ... | 365/185.22 |
| 7,230,848 B2* | 6/2007 | Forbes .................. | 365/185.03 |
| 7,301,818 B2* | 11/2007 | Lu et al. ............... | 365/185.24 |
| 2007/0196982 A1* | 8/2007 | Eitan ..................... | 438/257 |

2008/0151642 A1* 6/2008 Wu ..................... 365/185.29

FOREIGN PATENT DOCUMENTS

TW 200639863 11/2006

OTHER PUBLICATIONS

Chao-Hsin Chien, "Novel Structure Nanocrystal Flash Memories" Report of Project Supported by National Science Council, Taiwan, Oct. 15, 2006, pp. 1-6.
Daniel C. Guterman et al., "An Electrically Alterable nonvolatile Memory Cell Using a Floating-Gate Structure" IEEE Journal of Solid-State Circuits, vol. SC-14, No. 2, Apr. 1979, pp. 498-508.
Chinese Examination Report of Taiwan Application No. 095146582, dated Aug. 4, 2009.

* cited by examiner

*Primary Examiner*—Hoai V Ho
(74) *Attorney, Agent, or Firm*—J.C. Patents

(57) ABSTRACT

A method of operating a multi-level cell is described, wherein the cell includes a substrate of a first conductivity type, a control gate, a charge-storing layer and two S/D regions of a second conductivity type. The method includes an erasing step that injects charges of a first type into the charge-storing layer and a programming step that includes applying a first voltage to the substrate, a second voltage to both S/D regions and a third voltage to the control gate. The difference between the first and second voltages is sufficient to cause band-to-band tunneling hot holes, and the third voltage causes charges of a second type to enter the charge-storing layer. The third voltage can have $2^n-1$ different values, for programming the cell to a predetermined state among $2^n-1$ storage states.

14 Claims, 2 Drawing Sheets

METHOD OF OPERATING MULTI-LEVEL CELL

BACKGROUND OF THE INVENTION

1. Field of the Invention

The present invention relates to an operating method of a semiconductor device. More particularly, the present invention relates to an operating method of a multi-level cell (MLC) of a non-volatile memory, which utilizes a double-side bias band-to-band tunneling hot hole (DSB-BTBTHH) effect in programming.

2. Description of the Related Art

With the rapid growth of information flow in the world, the requirement for the storage capacity of electrically erasable programmable non-volatile memory devices, such as flash memory devices, continuously gets higher in the market.

The most direct way to increase the unit-area storage capacity of a non-volatile memory product is to reduce the lateral area of each memory cell, while this is limited by the lithographic resolution and some dimension-relating electrical properties, etc. Another way is to allow each memory cell to store more than one bit of data, which may be done by making a cell have one of $2^n$ ($n \geq 2$) threshold voltages that correspond to $2^n$ storage states. Such a memory cell is called a multi-level cell (MLC).

In conventional MLC operation, the erasing is done by ejecting electrons out of the charge-storing layer of the cell through Fowler-Nordheim (FN) tunneling, and the programming by injecting electrons into the same through FN tunneling. The amount of injected electrons is controlled by the programming time so that a cell has a threshold voltage (Vt) corresponding to the predetermined storage state thereof.

However, because the efficiency of injecting or ejecting electrons through FN tunneling is low, the erasing or programming is slow in the prior art. Moreover, since the erasing step ejects electrons out of the charge-storing layer, the threshold voltage of the cell is lower in the erased state causing more leakage. Further, the programming step that controls the threshold voltage in time mode cannot precisely control the amount of injected electrons, so that the Vt-distribution of each storage state is broad easily causing error in the reading.

SUMMARY OF THE INVENTION

In view of the foregoing, this invention provides a method of operating a multi-level cell, which utilizes a double-side bias band-to-band tunneling hot hole (DSB-BTBTHH) effect to solve the problems in the prior art.

The memory cell to which this invention is applicable includes a substrate of a first conductivity type, a control gate, a charge-storing layer between the substrate and the control gate, and two source/drain (S/D) regions of a second conductivity type. The method of operating a multi-level cell of this invention includes an erasing step that injects charges of a first type into the charge-storing layer and a programming step that applies a first voltage to the substrate, a second voltage to both S/D regions and a third voltage to the control gate, wherein the voltage application to both S/D regions is namely a double-side bias (DSB) application. The difference between the first and the second voltages is sufficient to cause band-to-band tunneling hot holes, and the third voltage causes charges of a second type to enter the charge-storing layer. The third voltage can have $2^n-1$ ($n \geq 2$) different values, for programming the cell to a predetermined state among $2^n-1$ storage states. The difference between the first and second voltages is within the range of 4V to 6V, for example.

In some embodiments, the first conductivity type is P-type, the second conductivity type is N-type, charges of the first type are electrons, charges of the second type are electric holes, the second voltage is higher than the first voltage, and the third voltage is lower than or equal to the first voltage. In such embodiments, for example, the first voltage is 0V, the second voltage is within the range of 4V to 6V, and the $2^n-1$ ($n \geq 2$) different values of the third voltage are within the range of −10V to 0V.

In the MLC operating method of this invention, the erasing step may utilize the DSB-BTBTHH effect or an FN-tunneling effect to inject charges of the first type into the charge-storing layer.

When the erasing step utilizes the DSB-BTBTHH effect, it may include applying the first voltage to the substrate, the second voltage to both S/D regions and a fourth voltage to the control gate, wherein the fourth voltage drives charges of the first type into the charge-storing layer. When the first conductivity type is P-type and the second conductivity type is N-type, charges of the first type are electrons, charges of the second type are electric holes, the second voltage is higher than the first voltage, and the fourth voltage is higher than the first voltage. For example, the first voltage is 0V, the second voltage is within the range of 4V to 6V, and the fourth voltage is within the range of 8V to 12V.

When the erasing step utilizes the FN-tunneling effect, it may include applying the first voltage to the substrate and both of the S/D regions and applying a fifth voltage to the control gate, wherein the difference between the first and the fifth voltages is sufficient to induce FN-tunneling and thereby inject charges of the first type into the charge-storing layer. When the first conductivity type is P-type and the second one is N-type, charges of the first type are electrons, charges of the second type are electric holes, and the fifth voltage is higher than the first voltage. For example, the first voltage is 0V, and the fifth voltage is within the range of 10V to 20V.

In addition, the charge-storing layer that may include a floating gate, a charge-trapping layer or a nano-crystal layer, and n is possibly equal to 2 so that the multi-level cell has totally 4 ($=2^2$) storage states. Moreover, a verify operation may be performed after the programming step to check whether the multi-level cell has been programmed to the predetermined storage or not.

Since the MLC operating method of this invention conducts programming with the DSB-BTBTHH effect that makes a charge-injection rate higher than that made by the FN-tunneling effect conventionally used to program a multi-level cell, it is more rapid in the programming. Moreover, because the amount of the electric holes injected with the DSB-BTBTHH effect can be precisely controlled by the voltage applied to the control gate as the programming time is fixed, the Vt-distribution of each storage state is narrower lowering the possibility of reading error.

It is to be understood that both the foregoing general description and the following detailed description are exemplary, and are intended to provide further explanation of the invention as claimed.

DESCRIPTION OF THE PREFERRED EMBODIMENTS

It is firstly noted that though this embodiment only describes a case where the first conductivity type is P-type, the second conductivity type is N-type, charges of the first type are electrons and charges of the second type are electric holes, one of ordinary skill in the art can understand, based on the following descriptions, that the method of this invention is also applicable to cases where the first conductivity type is N-type, the second conductivity type is P-type, charges of the first type are holes and charges of the second type are electrons.

Moreover, in a memory cell to which this invention can be applied, the charge-storing layer may include a floating gate, a charge-trapping layer or a nano-crystal layer. A floating gate usually includes doped poly-Si, a charge-trapping layer usually includes silicon nitride, and a nano-crystal layer usually includes many separate nano-crystals of a conductor material in a dielectric layer. Although only the cell including a charge-trapping layer is exemplified in this embodiment, one of ordinary skill in the art can understand, based on the following descriptions, that this invention is also applicable to a cell including a floating gate or a nano-crystal layer as a charge-storing layer.

Figure 1A:
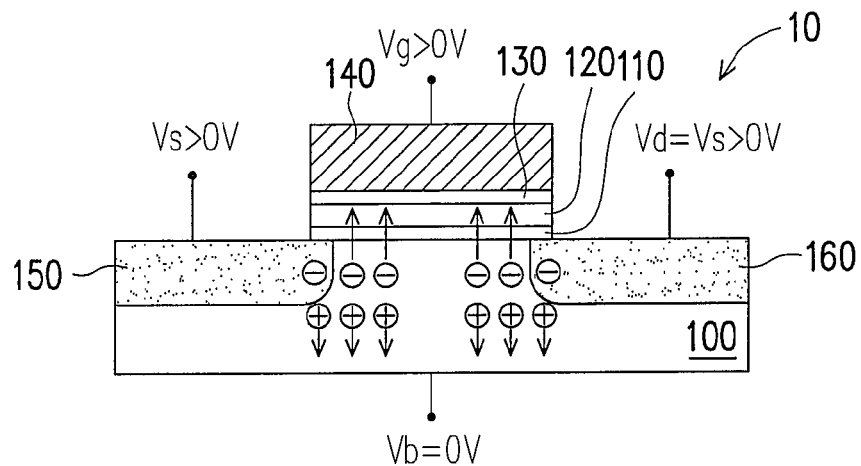
FIG. 1A depicts the erasing step utilizing DSB-BTBTHH in an MLC operating method according to an embodiment of this invention.
Figure 1B:
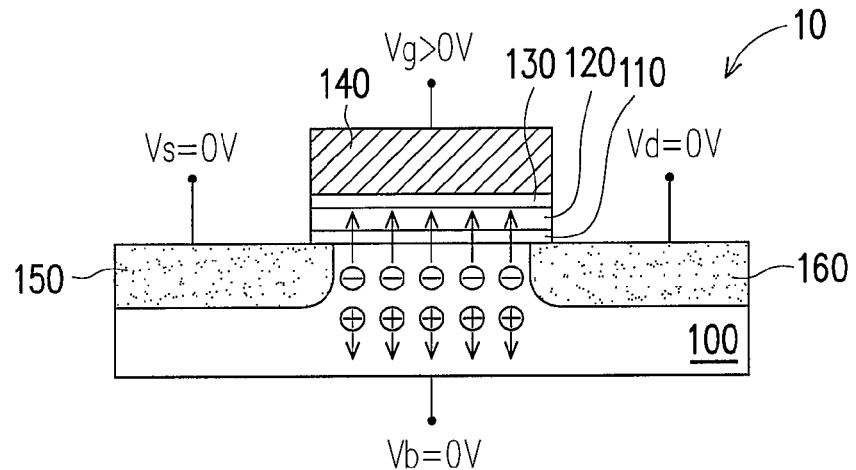
FIG. 1B depicts the erasing step utilizing FN-tunneling in an MLC operating method according to an embodiment of this invention.
Figure 2:
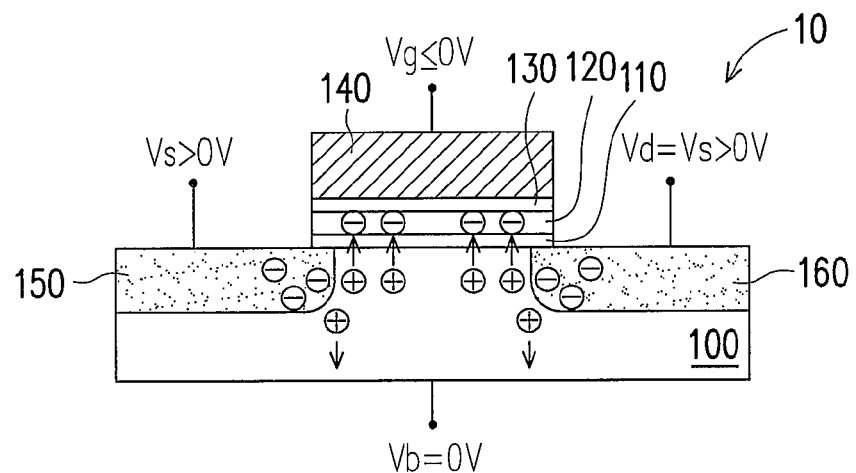
FIG. 2 depicts the programming step in an MLC operating method according to an embodiment of this invention.

Referring to FIGS. 1A, 1B & 2, the memory cell 10 in this embodiment includes a P-substrate 100, a bottom oxide layer 110, a nitride layer 120 as a charge-trapping layer, a top oxide layer 130 and a control gate 140 that are sequentially stacked on the substrate 100, and an N-type source region 150 and an N-type drain region 160 in the substrate 100 beside the control gate 140. One example of a cell having a floating gate as the charge-storing layer is the one obtained by replacing the three layers 110, 120 and 130 with a tunnel oxide layer, a poly-Si floating gate and an inter-gate dielectric layer, respectively. One example of a cell having a nano-crystal layer as the charge-storing layer is the one obtained by replacing the nitride layer 120 with an oxide layer that has many silicon nano-crystals therein.

FIG. 1A depicts the erasing step utilizing DSB-BTBTHH in an MLC operating method according to an embodiment of this invention. The P-substrate 100 is applied with 0V, the source region 150 and the drain region 160 respectively applied with a source voltage Vs and a drain voltage Vd (=Vs) higher than 0V, and the control gate 140 applied with a gate voltage Vg higher than 0V. The voltage Vs or Vd is high enough to cause band-to-band tunneling hot holes in the substrate 100 to generate electron/hole pairs, while the positive voltage Vg applied to the control gate 140 drives electrons into the nitride layer 120. The voltage Vs (=Vd) may be set within the range of 4V to 6V and the voltage Vg within the range of 8-12V. Since the DSB-BTBTHH effect makes a charge-injection rate higher than that made by the FN-tunneling effect conventionally utilized to erase a multi-level cell, the MLC operating method of this invention is more rapid in the erasing as utilizing the DSB-BTBTHH effect for erasing.

FIG. 1B depicts the erasing step utilizing FN-tunneling in an MLC operating method according to an embodiment of this invention. The P-substrate 100, the source region 150 and the drain region 160 are applied with 0V and the control gate 140 with a gate voltage Vg higher than 0V. The voltage Vg is high enough to induce the FN-tunneling effect that causes electrons to enter the nitride layer 120. The positive voltage Vg applied to the control gate 140 may be set within the range of 10V to 20V.

As mentioned above, the erasing step in the MLC operating method according to this embodiment of this invention injects electrons into the charge-storing layer, but not ejects electrons out of the same as in the prior art. Since a cell having electrons in its charge-storing layer has a higher threshold voltage, the leakage of the erased cells can be reduced in this embodiment of this invention.

FIG. 2 depicts the programming step in an MLC operating method according to an embodiment of this invention, which utilizes the above DSB-BTBTHH effect. The P-substrate 100 is applied with 0V, the source region 150 and the drain region 160 are respectively applied with a source voltage Vs and a drain voltage Vd (=Vs) higher than 0V, and the control gate 140 is applied with a gate voltage Vg lower than or equal to 0V. The voltage Vs (=Vd) is high enough to cause band-to-band tunneling hot holes in the substrate 100 and thereby generate electron/hole pairs, while the voltage Vg applied to the control gate 140 allows holes to enter the nitride layer 120. The voltage Vg can have $2^n-1$ ($n \geq 2$) different values that are all within the range of being lower than or equal to 0V, for programming the cell to the predetermined state among $2^n-1$ storage states. As the Vt-level of the predetermined state is lower, the absolute value of the gate voltage Vg required in the programming is larger, causing more holes to enter the nitride layer 120.

Since the DSB-BTBTHH effect makes a charge-injection rate higher than that made by the FN-tunneling effect that is conventionally utilized to program a multi-level cell, the MLC operating method of this invention is more rapid in the programming.

It is particularly noted that when a multi-level cell is not subjected to the above programming step during the data-storing process of the non-volatile memory apparatus including the cell, the storage state of the cell is the one having the highest threshold voltage, which is abbreviated to the highest-Vt storage state hereinafter. Therefore, the cell has totally $2^n$ storage states including the highest-Vt storage state. Since the threshold voltages of adjacent storage stares cannot be overly close to each other for preventing reading error, n is usually equal to 2 in consideration of the usual Vt-range for non-volatile memory. As n is equal to 2, the cell has totally four storage states, wherein the first to fourth storage states descending in the Vt-level correspond to the data values of 00, 01, 10 and 11, or to the data values of 11, 10, 01 and 00, respectively.

Moreover, a verify step may be conducted after the above programming step to check whether the cell has been programmed to the predetermined state or not. If the cell passes the verify step, subsequent operations are performed. If the cell fails in the verify step, it may be erased with one of the above two erasing steps and is programmed again as above.

Figure 3:
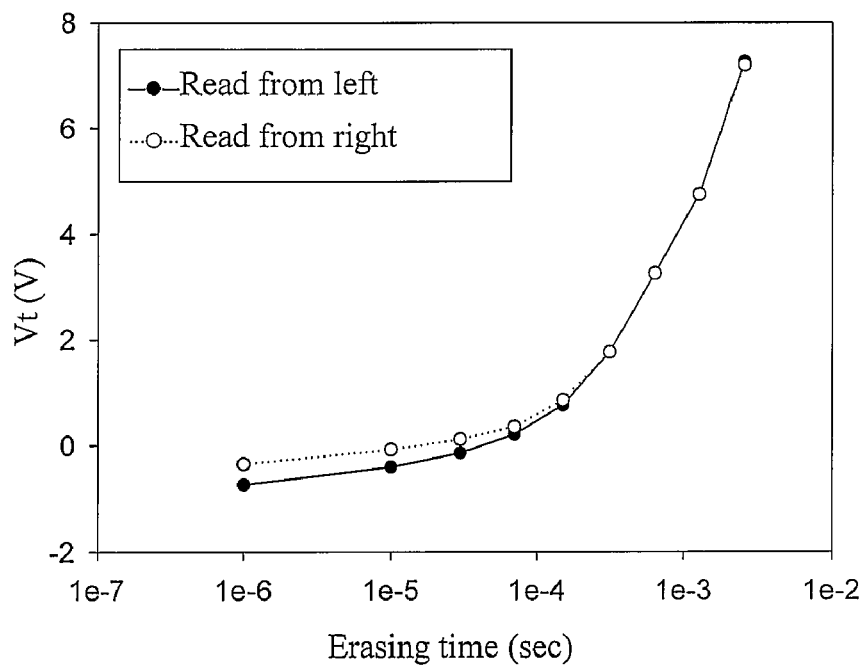
FIG. 3 shows the variation of the threshold voltage of a cell with time during the erasing step in an example of the MLC operating method of this invention.

FIG. 3 shows the variation of the threshold voltage of a cell with time during the erasing step in an example of the MLC operating method of this invention. In this example, the erasing is done with the DSB-BTBTHH effect in a bias configuration of Vb=0V, Vs=Vd=5V and Vg=10V, until the threshold voltage of the cell reaches about 7.6V.

Figure 4:
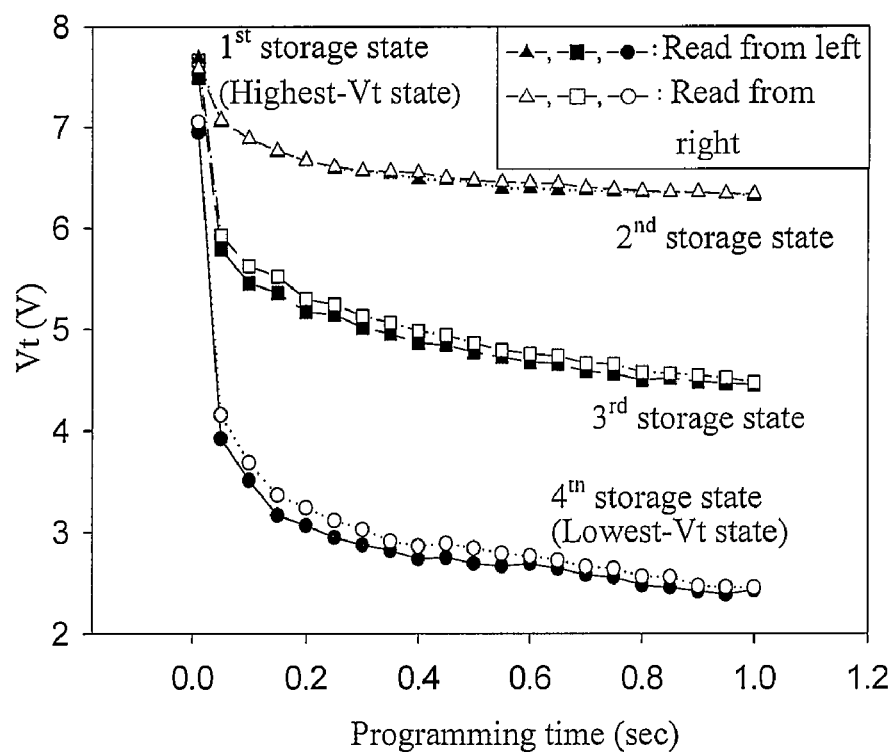
FIG. 4 shows the variation of the threshold voltage of the cell with time during the programming step in the example of the MLC operating method of this invention.

FIG. 4 shows the variation of the threshold voltage of the cell with time during the programming step in the example of the MLC operating method of this invention. The multi-level cell has four storage states corresponding to four Vt-levels and can store two bits of data, wherein the first to fourth storage states descending in the Vt-level may correspond to the data values of 00, 01, 10 and 11 respectively. The programming step is done with the DSB-BTBTHH effect in a bias configuration of Vb=0V, Vs=Vd=5V, and Vg being −6V, −7V or −8V for programming the cell to the $2^{nd}$, $3^{rd}$ or $4^{th}$ storage state.

As indicated by FIG. 4, by using the DSB-BTBTHH programming method of this invention, the Vt-reduction of the cell can be precisely controlled by the voltage applied to the control gate as the programming time is fixed, so that the Vt-distribution of each storage state is narrower lowering the possibility of reading error.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of operating a multi-level cell (MLC) that comprises a substrate of a first conductivity type, a control gate, a charge-storing layer between the substrate and the control gate and two source/drain (S/D) regions of a second conductivity type, comprising:
    an erasing step that injects charges of a first type into the charge-storing layer; and
    a programming step that utilizes a double-side bias band-to-band tunneling hot hole (DSB-BTBTHH) effect and comprises:
    applying a first voltage to the substrate, a second voltage to both of the S/D regions and a third voltage to the control gate, wherein
    a difference between the first and second voltages is sufficient to cause band-to-band tunneling hot holes, and the third voltage causes charges of a second type to enter the charge-storing layer and can have $2^n-1$ ($n \geq 2$) different values, for programming the cell to a predetermined state among $2^n-1$ storage states.

2. The method of claim 1, wherein the difference between the first and second voltages is within a range of 4V to 6V.

3. The method of claim 1, wherein the first conductivity type is P-type, the second conductivity type is N-type, charges of the first type are electrons, charges of the second type are electric holes, the second voltage is higher than the first voltage, and the third voltage is lower than or equal to the first voltage.

4. The method of claim 3, wherein the first voltage is 0V, the second voltage is within a range of 4V to 6V, and the $2^n-1$ ($n \geq 2$) different values of the third voltage are within a range of −10V to 0V.

5. The method of claim 1, wherein the erasing step utilizes the DSB-BTBTHH effect or an FN-tunneling effect to inject charges of the first type into the charge-storing layer.

6. The method of claim 5, wherein the erasing step utilizes the DSB-BTBTHH effect and comprises:
    applying the first voltage to the substrate, the second voltage to both of the S/D regions and a fourth voltage to the control gate, wherein the fourth voltage drives charges of the first type into the charge-storing layer.

7. The method of claim 6, wherein the first conductivity type is P-type, the second conductivity type is N-type, charges of the first type are electrons, charges of the second type are electric holes, the second voltage is higher than the first voltage, and the fourth voltage is higher than the first voltage.

8. The method of claim 7, wherein the first voltage is 0V, the second voltage is within a range of 4V to 6V, and the fourth voltage is within a range of 8V to 12V.

9. The method of claim 5, wherein the erasing step utilizes the FN-tunneling effect and comprises:
    applying the first voltage to the substrate and both of the S/D regions and applying a fourth voltage to the control gate, wherein a difference between the first and the fourth voltages is sufficient to induce FN-tunneling and thereby inject charges of the first type into the charge-storing layer.

10. The method of claim 9, wherein the first conductivity type is P-type, the second conductivity type is N-type, charges of the first type are electrons, charges of the second type are electric holes, and the fourth voltage is higher than the first voltage.

11. The method of claim 10, wherein the first voltage is 0V and the fourth voltage is within a range of 10V to 20V.

12. The method of claim 1, wherein the charge-storing layer comprises a floating gate, a charge-trapping layer or a nano-crystal layer.

13. The method of claim 1, wherein n is equal to 2 and the multi-level cell has 4 storage states in total.

14. The method of claim 1, further comprising a verify step that is conducted after the programming step to check whether the multi-level cell has been programmed to the predetermined state or not.

* * * * *